United States Patent [19]
Van Auken

[11] Patent Number: 5,973,486
[45] Date of Patent: *Oct. 26, 1999

[54] DIFFERENTIAL POWER SENSOR CIRCUIT

[75] Inventor: Jeffrey B. Van Auken, Littleton, Mass.

[73] Assignee: Sipex Corporation, Billerica, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/941,840

[22] Filed: Oct. 1, 1997

[51] Int. Cl.$^6$ ...................................................... G05F 1/40
[52] U.S. Cl. ............................................ 323/274; 327/143
[58] Field of Search .................................... 327/143, 198, 327/427, 437; 323/274, 281, 313, 314

[56] References Cited

U.S. PATENT DOCUMENTS

| | | | |
|---|---|---|---|
| 5,180,926 | 1/1993 | Skripek | 327/143 |
| 5,378,936 | 1/1995 | Kukubo et al. | 327/143 |
| 5,684,417 | 11/1997 | Huang et al. | 327/143 |

OTHER PUBLICATIONS

Sipex Corporation "Schematic for a Power–up Circuit in Sipex Corporation's SP9500 integrated circuit", 1995 1 pg. Billerica, MA.

*Primary Examiner*—Shawn Riley
*Attorney, Agent, or Firm*—Testa, Hurwitz & Thibeault, LLP

[57] ABSTRACT

A power sensor circuit including an input terminal, a switch, a nonlinear voltage drop element, and a switching unit, wherein the switching unit provides an output voltage. In response to a voltage difference between a first reference voltage and a second reference voltage, the power sensor circuit outputs a voltage that varies between two states. In one embodiment, the first state is substantially equal to the second reference voltage and the second state is substantially equal to ground. In another embodiment, the power sensor circuit is composed of four metal oxide semiconductor field effect transistors (MOSFETs) that compare a first reference voltage with a second reference voltage and determine whether the second reference voltage exceeds the first reference voltage by a predetermined voltage. If so, then the second reference voltage is produced at the output terminal of the power sensor circuit. Conversely, if the second reference voltage does not exceed the first reference voltage by the same predetermined level, then the output terminal is substantially at ground. The invention also relates to a method for generating a power sensing circuit.

12 Claims, 4 Drawing Sheets

DIFFERENTIAL POWER SENSOR CIRCUIT

FIELD OF THE INVENTION

The invention relates to power conservation circuitry, and more specifically to a comparator that determines which voltage source to provide to a desired circuit.

BACKGROUND OF THE INVENTION

A power sensor circuit is used to monitor the power requirements of a circuit. In general, such a power sensor circuit may be used with, but not limited to, systems containing an internal battery and powered by an external power supply. For example, if in such a circuit a reduction of power provided by an external power supply is detected, then the battery is selected to provide power to the circuit. When the external power from the external power supply is restored above the predetermined voltage, the battery then ceases to deliver power until the next event occurs. However, for such power sensor circuitry to be useful, the circuit must detect the loss of power from the external source and not consume much power on their own. The present invention relates to a low power consumption power sensor circuit.

SUMMARY OF THE INVENTION

The invention relates to a power sensor circuit that, in one embodiment, includes an input terminal adapted to receive a first reference voltage, and a nonlinear voltage drop element having a first terminal in electrical communication with the input terminal. The circuit also includes a switch having a control terminal adapted to receive a second reference voltage, a first terminal adapted to receive a third reference voltage, and a second terminal in electrical communication with a second terminal of the non-linear voltage drop element. The power sensor circuit also includes a switching unit having a first input terminal in electrical communication with the second terminal of the switch, a second input terminal adapted to receive a fourth reference voltage, a third input terminal adapted to receive the fifth reference voltage, and an output terminal. The switching unit provides an output voltage in response to a voltage difference between the first reference voltage and the second reference voltage; the output voltage from the switching unit varying between two states. The first state of the output voltage is substantially equal to the fourth reference voltage and the second state is substantially equal to the fifth reference voltage. In one embodiment, the first reference voltage is a supply voltage, the second and fourth reference voltages are a battery voltage, and the third and fifth reference voltages ground.

In one embodiment of the invention, the power sensor circuit compares a first reference voltage with a second reference voltage and determines whether the second reference voltage exceeds the first reference voltage by a predetermined voltage. If so, then the second reference voltage is produced at the output terminal of the switching unit. Conversely, if the second reference voltage does not exceed the first reference voltage by the same predetermined level, then the output terminal is substantially at ground.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

Like reference characters in the respective drawn figures indicate corresponding parts.

DESCRIPTION OF THE INVENTION

The invention relates to a circuit that compares two reference voltages, and based on circuit conditions delivers one of two possible output voltages to an output terminal. For example, if one of the two reference voltages does not exceed the other reference voltage by a predetermined level during normal operation, then the power sensor circuit is designed to deliver an output to an output terminal which informs a desired circuit of the condition. More specifically, this circuit is designed to deliver the battery voltage to an output terminal if the bias supply voltage is less than the battery voltage minus the predetermined voltage. However, if the bias supply is greater than the battery voltage minus the predetermined voltage, then the output terminal will remain at ground. In one embodiment, the predetermined voltage is one volt.

Figure 1:
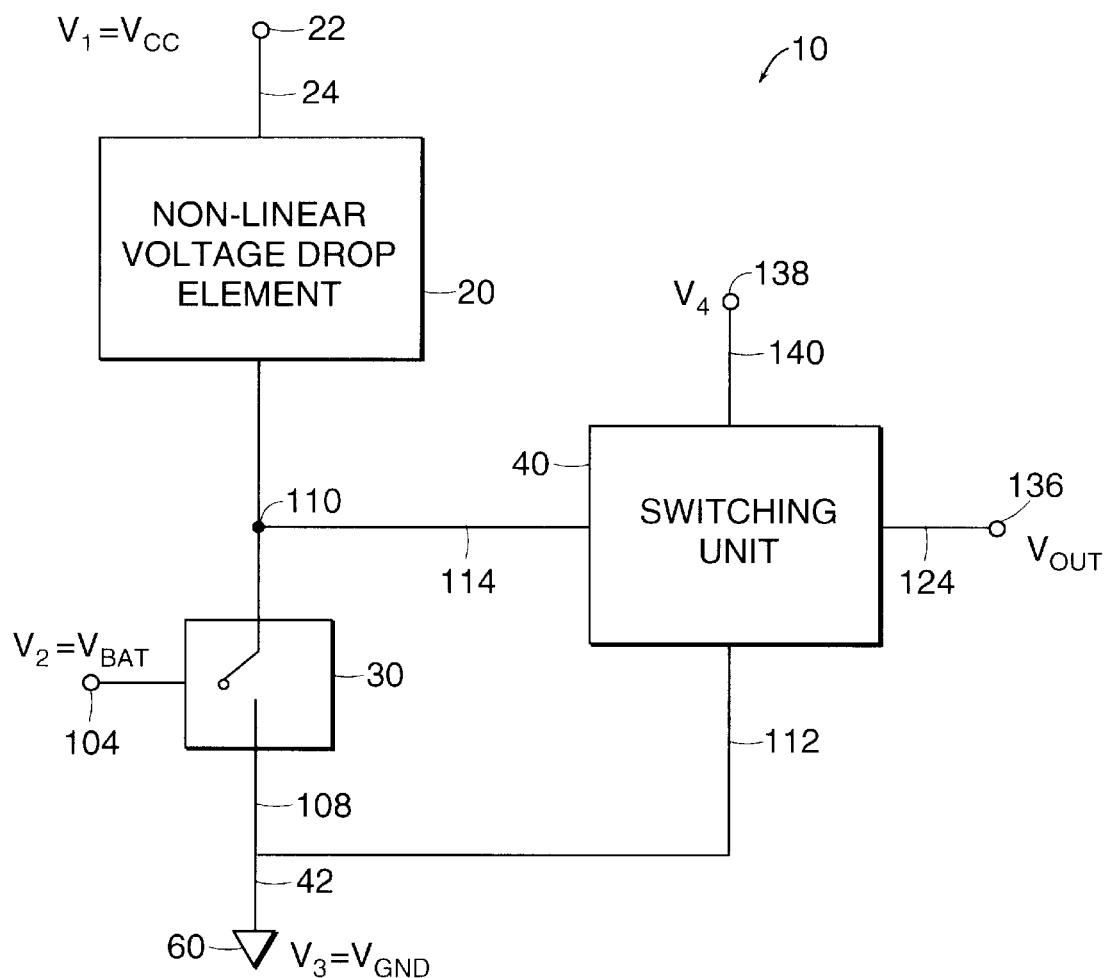
FIG. 1 is a block diagram of an embodiment of the power sensor circuit of the invention.

In broad overview and referring to FIG. 1, an embodiment of a power sensor circuit 10 of the invention includes a non-linear voltage drop element 20 that is electrically coupled to a reference bias voltage $V_1$ 22 by an input terminal 24. The circuit includes the switch 30 that is controlled by a reference voltage $V_2$ 104, and a switching unit 40 that has a first terminal 114 in electrical communication with both the non-linear voltage drop element 20 and one terminal 36 of the switch 30 at a junction 110. The switching unit 40 is also in electrical communication with a second terminal 108 of the switch 30 and with a reference voltage $V_3$ 60 through the terminal 112. In one embodiment, the reference voltage $V_3$ 60 is ground. The output terminal 124 of the switching unit 40 provides an output voltage $V_{out}$ 136 relative to the reference voltage $V_3$ 60. The switching unit 40 is also in electrical communication with another reference voltage $V_4$ 138 through a terminal 140.

Figure 2:
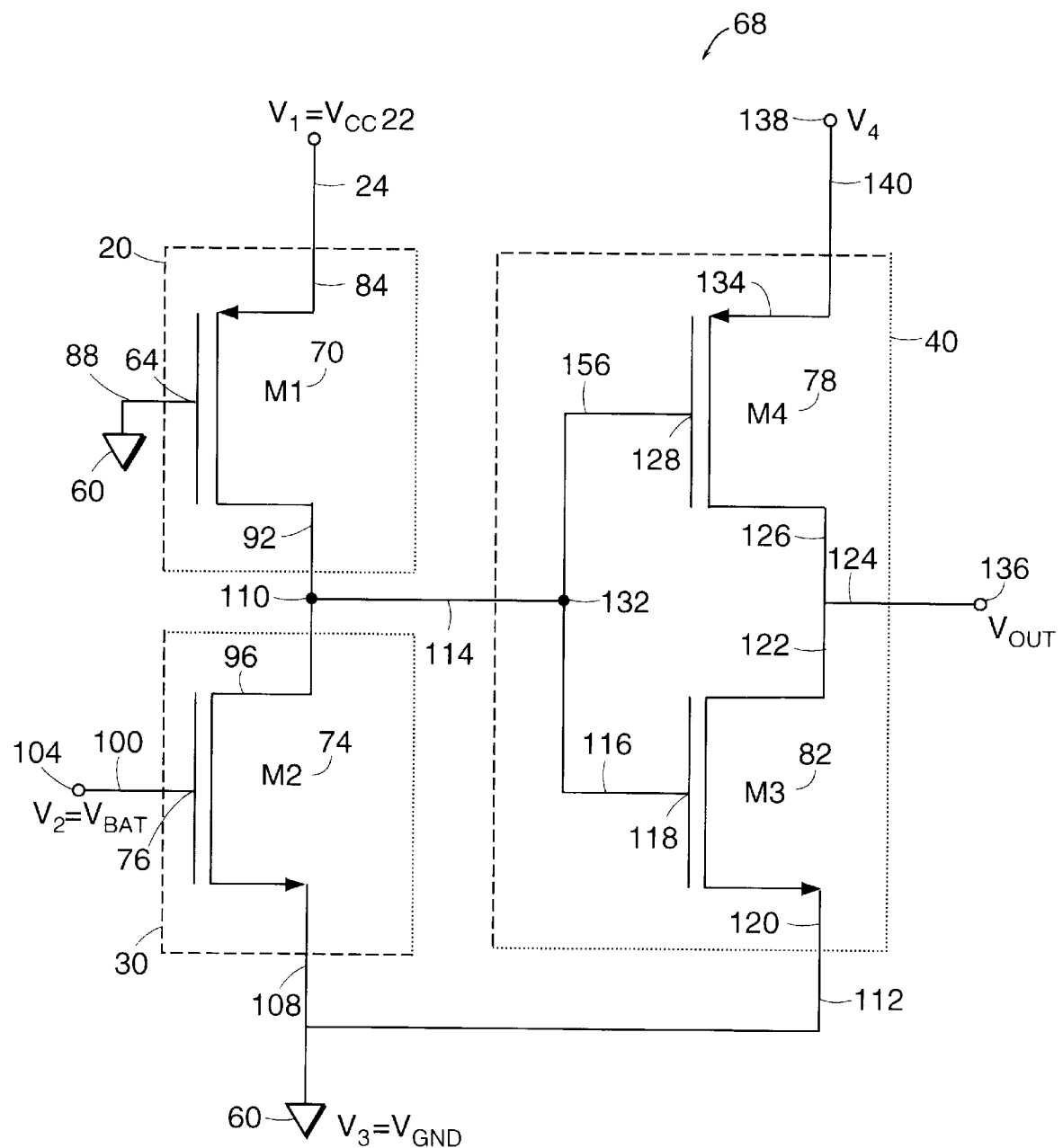
FIG. 2 is a schematic diagram of an embodiment of the power sensor circuit shown in FIG. 1.

In more detail and referring to FIG. 2, in one embodiment, the power sensor circuit 68 includes four transistors 70, 74, 78, 82 corresponding to the non-linear voltage drop element 20, the switch 30 and the switching unit 40. In one such embodiment, the four transistors 70, 74, 78, 82 are metal oxide semiconductor field effect transistors (MOSFETs). The non-linear voltage drop element 20 is a first P-channel MOSFET $M_1$ 70 in electrical communication with a first reference voltage $V_1$ 22 through the source terminal 84. In one embodiment, the first reference voltage $V_1$ 22 is a supply voltage $V_{cc}$. The transistor $M_1$ 70 has a gate 64 in electrical communication with ground 60 through the terminal 88 and the drain 92 is in electrical communication with the drain 96 of a second transistor $M_2$ 74. The transistor $M_2$ 74 has a gate 76 in electrical communication with a second reference voltage $V_2$ 104 through a terminal 100, and the source terminal 108 is in electrical communication with the third reference voltage $V_3$ 60 and the terminal 112 of the switching unit 40. In one embodiment, the second reference voltage $V_2$ 104 is a battery voltage $V_{bat}$. In another embodiment, the third reference voltage $V_3$ 60 is ground. The drains 92 and 96 of both the transistors $M_1$ 70 and $M_2$ 74 are in electrical communication with the junction 110 which is in turn in electrical communication with an input terminal 114 of the switching unit 40.

The switching unit 40, shown in FIG. 2, includes the two transistors $M_3$ 82 and $M_4$ 78. The transistor $M_3$ 82 is a N-channel type MOSFET device with the source terminal 120 as the third terminal 112 of the switching unit 40. The transistor $M_4$ 78 is a P-channel type MOSFET device with the source terminal 134 as the fourth terminal 140 of the switching unit 40. The fourth terminal 140 is in electrical communication with a fourth reference voltage $V_4$ 138. In one embodiment, the fourth reference voltage $V_4$ 138 and the second reference voltage $V_2$ 104 are supplied by a battery $V_{bat}$. The transistor $M_3$ 82 has a gate 118 in electrical communication with the gate 128 of the transistor $M_4$ 78 at the junction 132. The junction 132 receives an input voltage applied to the terminal 114 of the switching unit 40. Specifically, the input signal transmitted at the terminal 114 to the switching unit 40 is a voltage output at the junction 110 from the drain 92 of the transistor $M_1$ 70 and from the drain 96 of the transistor $M_2$ 74. An output voltage $V_{out}$ 136 is provided from the switching unit 40 at the output terminal 124 which electrically connects the drains 122 and 126 of the transistors $M_3$ 82 and $M_4$ 78 respectively.

Figure 3:
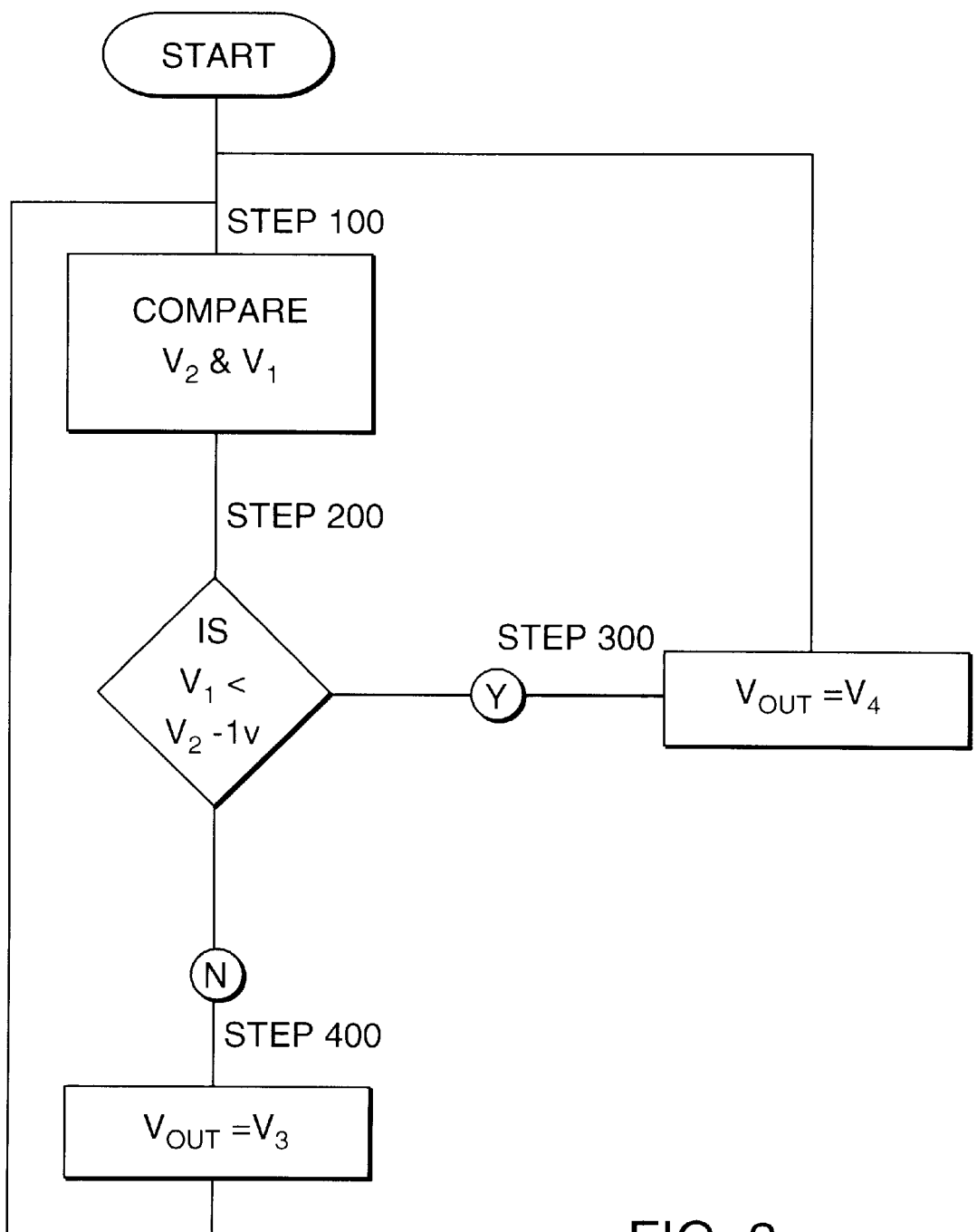
FIG. 3 is a flow chart of the functionality of one embodiment of the power sensor circuit of the invention.

The operation of the circuit 68 is described with reference to the flow chart shown in FIG. 3. In the embodiment shown in FIG. 2, the output voltage $V_{out}$ 136 has two states, substantially equal to the fourth reference voltage $V_4$ 138 or to the third reference voltage $V_3$ 60. The circuit 68 operates in the following manner. The circuit 68 first continuously compares (Step 100) the reference voltage $V_1$ 22 with the reference voltage $V_2$ 104, and determines (Step 200) whether the reference voltage $V_1$ 22 is less than $V_2$ 104 minus a predetermined voltage. In one embodiment, the predetermined voltage is approximately one volt. If so, then $V_4$ 138 is presented (Step 300) as the output voltage $V_{out}$ 136. In one embodiment of FIG. 2, the reference voltage $V_4$ 138 is equal to the reference voltage $V_2$ 104, both of which equal a battery potential $V_{bat}$. Accordingly, in an embodiment in which the predetermined voltage equals approximately one volt, if the reference voltage $V_1$ 22 is less than the battery voltage $V_{bat}$ 104 minus one volt, then the reference voltage $V_{bat}$ 138 is presented as the output voltage $V_{out}$ 136. Conversely, if the reference voltage $V_1$ 22 is greater than the reference voltage $V_2$ 104 minus a predetermined voltage, then the output voltage $V_{out}$ 136 is set (Step 400) to the reference voltage $V_3$ 60. As described above, in one embodiment, the reference voltage $V_3$ is ground. If the terminal 112 is not in electrical communication with ground but instead to another reference voltage, then a low signal is presented at $V_{out}$ 136. For example, in one embodiment, the reference voltage $V_3$ 60 could be a negative voltage. Typically, the comparison in (Step 100) between the reference voltage $V_1$ 22 and the reference voltage $V_2$ 104 depends on the conductance requirements for the transistors $M_1$ 70 and $M_2$ 74. The output voltage $V_{out}$ 136 presented by the switching unit 40 depends upon both the conductance characteristics of the transistors $M_3$ 82 and $M_4$ 78, and the input voltage at the input terminal 114 to the switching unit 40 from the drains 92 and 96 of the transistors $M_1$ 70 and $M_2$ 74 respectively.

Figure 4:
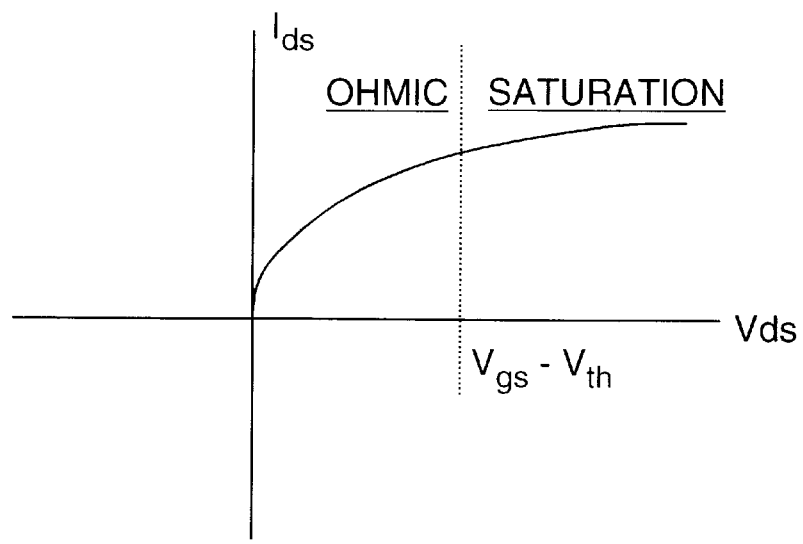
FIG. 4 is a graph of the I–V characteristics for an embodiment of the power sensor circuit of the invention.

The underlying concept of the power sensor circuit 68 utilizes the drain to source current ($I_{ds}$) versus the drain to source voltage ($V_{ds}$) characteristics of a MOSFET. As shown in FIG. 4, the graph of $I_{ds}$ versus $V_{ds}$ is separated into an ohmic and saturation region (these regions are also called the triode and pinch-off regions respectively). The two regions are defined by three factors: (1) the gate to source voltage ($V_{gs}$), (2) the drain to source voltage ($V_{ds}$), and (3) the threshold voltage ($V_{th}$) of the particular MOSFET. Typically, $V_{gs}$ is a variable quantity, and $V_{th}$ has a value that often lies between one half and one volt. However, in complementary-symmetry MOS technology (CMOS), $V_{th}$ is often approximately one volt. When the condition $V_{ds} > V_{gs} - V_{th}$ is reached, the device is driven into saturation. The operation of these parameters gives rise to the well known family of curves that characterize a transistor.

In one embodiment of the present invention, the power sensor circuit 68 is used to indicate when the bias voltage $V_{cc}$ 22 is above or below the battery potential $V_{bat}$ 104 minus one volt. In one such embodiment, $V_4$ 138 is also equal to $V_{bat}$ 104 and the reference voltage $V_3$ 60 is equal to ground. In broad overview and referring to the transistor $M_2$ 74 in FIG. 2 and the diagram of FIG. 4, if the following equation holds:

$$V_{ds} \leq V_{bat} - V_{th},$$

then the transistor $M_2$ 74 is in the ohmic region where the transistor characteristics are similar to those of a resistor and the conductance of the device varies with the drain voltage. However, if the drain to source voltage is greater than $V_{bat}$ 104 minus the threshold voltage $V_{th}$, then transistor $M_2$ 74 is in the saturation region, and as shown in FIG. 4, the transistor becomes a current source and the conductance of transistor $M_2$ 74 remains relatively constant. Because the threshold voltage $V_{th}$ is approximately one volt for CMOS processing, the battery voltage ($V_{bat}$) minus the threshold voltage ($V_{th}$) equals the bias voltage $V_{cc}$ 22 minus one volt where $M_2$ goes from ohmic to saturation. As a result, the main condition for the power sensor circuit 68 is realized.

Referring to FIG. 4, the drain to source current ($I_{ds}$) versus the drain to source voltage ($V_{ds}$) curve shows a significant change in the slope between the ohmic and saturation regions. This slope is directly proportional to the conductance of the MOSFET. The transistor $M_1$ 70 is electrically coupled so that the source 84 and the drain 92 are in series with $V_{cc}$ 22 and the drain 96 of the transistor $M_2$ 74. As the bias voltage $V_{cc}$ 22 starts at zero volts (LOW), the conductance of the transistor $M_1$ 70 is much lower than the conductance of the transistor $M_2$ 74. Therefore, the input voltage at the input terminal 114 of the switching unit 40 equals ground 60 indicating that the bias voltage 22 is less than the battery voltage $V_{bat}$ 104 minus one volt. When the bias voltage 22 increases beyond the battery voltage $V_{bat}$ 104 minus one volt, the drain 92 of the transistor $M_1$ 70 reaches saturation and the conductance of the transistor $M_1$ 70 increases. This combination pulls the input voltage at the terminal 114 of the switching unit 40 to substantially equal the bias voltage $V_{cc}$ 22 which indicates that the bias voltage 22 is greater than the battery voltage $V_{bat}$ 104 minus one volt. The transistors $M_3$ 82 and $M_4$ 78 of the switching unit 40 provide further amplification to get a full CMOS "1" or "0" digital output and determines the output voltage $V_{out}$ 136 presented through the output terminal 124 of the switching unit 40.

Similar to the operation of the transistors $M_1$ 70 and $M_2$ 74, the power sensor circuit 68 relies on the conductive characteristics of the two MOSFETs 82 and 78 in the switching unit 40 to complete the primary functions of the circuit 68. As previously described, when the input voltage at the input terminal 114 of the switching unit 40 is high, the bias voltage 22 is greater than the battery voltage $V_{bat}$ 104 minus one volt, the transistor $M_3$ 82 becomes very conductive and $V_{out}$ 136 is equal to zero volts. Alternatively, when the input voltage at the input terminal 114 of the switching unit 40 is low, the bias voltage 22 is less than the battery voltage $V_{bat}$ 104 minus one volt, the transistor $M_4$ 78 becomes more conductive and $V_{out}$ 136 equals a fourth reference voltage $V_4$ 138. However, in one embodiment, the fourth reference voltage $V_4$ 138 is in electrical communication with the battery voltage $V_{bat}$ 104. Accordingly, the battery voltage $V_{bat}$ 104 is presented to the output terminal 124. In addition, $V_{out}$ 136 may also be an input to another series of switching units comprised of MOSFETs electrically coupled as described above. Although the output voltage $V_{out}$ 136 has been described as switching when the bias voltage 22 is less than the battery voltage minus one volt, in other embodiments, $V_{out}$ 136 may switch when the bias voltage 22 is less than the battery voltage by another predetermined voltage.

The function and operation of the power sensor circuit 68 has been described. The circuit 68 has primarily two states for which the bias voltage $V_{cc}$ 22 is compared to a battery voltage $V_{bat}$ 104 and those two states are summarized in Table I.

TABLE I

The Two States of the Power Sensor Circuit

| Condition | $V_{CC}$ | Logic Equivalent | $V_{out}$ |
| --- | --- | --- | --- |
| State 1: | <$V_{bat}$ - 1v | HIGH | $V_{bat}$ |
| State 2: | >$V_{bat}$ - 1v | LOW | $V_3$ |

Figure 5:
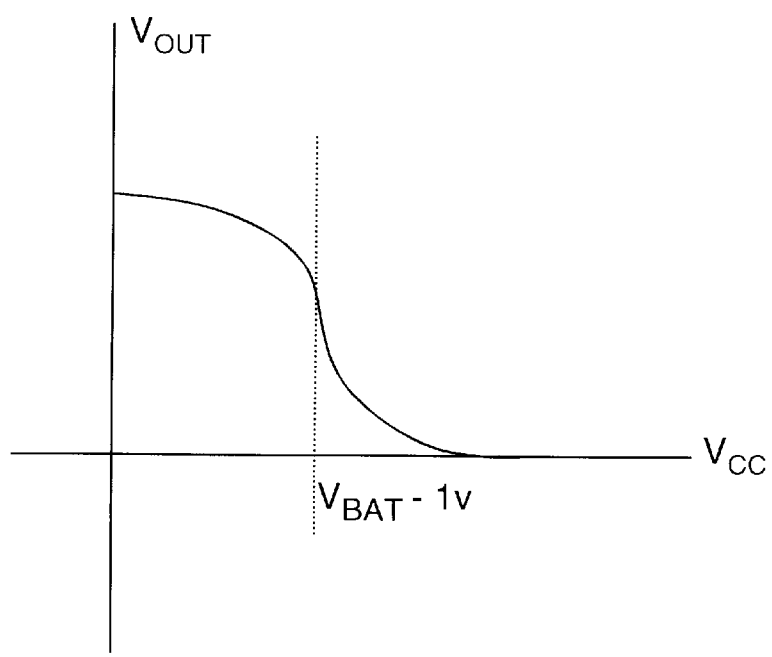
FIG. 5 is a graph of the switching characteristics for the output voltage of an embodiment the power sensor circuit.

Table I shows that the power sensor circuit 68 will deliver either the battery voltage $V_{bat}$ to an output terminal or a voltage equivalent to ground ($V_3$). If $V_3$ is delivered, then this implies that the output terminal is substantially at ground or that the output was driven to a logical zero. As shown in FIG. 5, the switching characteristics for the power sensor circuit 68 approximate a step function. For a bias voltage ($V_{cc}$) less than a battery voltage minus one volt, the output voltage ($V_{out}$) is high, and for one embodiment of the power sensor circuit 68, this results in $V_{bat}$ being presented to the output terminal $V_{out}$ 136. For a bias voltage greater than a battery voltage minus one volt, the output voltage $V_{out}$ is low (a logical zero) or asymptotically decreases to zero, and for one embodiment of the power sensor circuit 68, this results in a voltage substantially equivalent to ground being presented to the output terminal $V_{out}$ 136. Thus, the main function of the power sensor circuit 68 of providing an indication when the battery voltage exceeds the bias voltage by a predetermined voltage is obtained.

Having described preferred embodiments of the invention, it will now become apparent to one of skill in the art that other embodiments incorporating the concepts may be used. It is felt, therefore, that these embodiments should not be limited to disclosed embodiments but rather should be limited only by the spirit and scope of the following claims.

What is claimed is:

1. A differential power sensor circuit comprising:
    an input terminal adapted to receive a first reference voltage;
    a switch having a control terminal adapted to receive a second reference voltage, a first terminal adapted to receive a third reference voltage, and a second terminal, the second reference voltage controlling said switch;
    a nonlinear voltage drop element disposed between said second terminal of said switch and said input terminal; and
    a switching unit having a first input terminal in electrical communication with said second terminal of said switch, a second input terminal adapted to receive the second reference voltage, a third input terminal adapted to receive a fifth reference voltage, and an output terminal,
    wherein said switching unit provides an output voltage at said output terminal of said switching unit, the output voltage varying between a first state substantially equal to the second reference voltage and a second state substantially equal to the fifth reference voltage in response to a voltage difference between the first reference voltage and the second reference voltage.

2. The power sensor circuit of claim 1 wherein the fifth reference voltage is equal to the third reference voltage.

3. The power sensor circuit of claim 1 wherein the first reference voltage is a supply voltage, the second reference voltage is a battery voltage, the third reference voltage is ground and the fifth reference voltage is ground.

4. The power sensor circuit of claim 1 wherein said switching unit further comprises an impedance converter comprising:
    a first MOSFET having a source terminal in electrical communication with said second input terminal of said switching unit, a gate terminal in electrical communication with said first input terminal of said switching unit, and a drain terminal in electrical communication with said output terminal of switching unit; and
    a second MOSFET having a source terminal in electrical communication with said third terminal of said switching unit, a gate terminal in electrical communication with said first input terminal of said switching unit, and a drain terminal in electrical communication with said output terminal of said switching unit, said second MOSFET being a different channel type than said first MOSFET.

5. The power sensor circuit of claim 1 wherein said nonlinear voltage drop element comprises a MOSFET having a source terminal in electrical communication with said input terminal, a gate terminal adapted to receive the third reference voltage, and a drain terminal in electrical communication with said second terminal of said switch.

6. The power sensor circuit of claim 1 wherein said switch comprises a MOSFET having a drain terminal in electrical communication with said nonlinear voltage drop element, a gate terminal adapted to receive the second reference voltage, and a source terminal adapted to receive the third reference voltage.

7. The power sensor circuit of claim 1 wherein said nonlinear voltage drop element comprises a first MOSFET having a source terminal in electrical communication with said input terminal, a gate terminal adapted to receive the third reference voltage, and a drain terminal; and
    wherein said switch comprises a second MOSFET having a drain terminal in electrical communication with said drain terminal of said first MOSFET, a gate terminal adapted to receive the second reference voltage, and a source terminal adapted to receive the third reference voltage, said second MOSFET being a different channel type than said first MOSFET.

8. The power sensor circuit of claim 1 wherein the output voltage is in the first state when the second reference voltage exceeds the first reference voltage by a predetermined voltage and is in the second state when the second reference voltage does not exceed the first reference voltage by the predetermined voltage.

9. The power sensor circuit of claim 8 wherein the predetermined voltage is approximately one volt.

10. A differential power sensor circuit, comprising:
a first voltage input terminal;
a second voltage input terminal;
a third voltage input terminal;
an output terminal;
a first MOSFET having a source terminal in electrical communication with said first voltage input terminal, a gate terminal in electrical communication with said third voltage input terminal, and a drain terminal;
a second MOSFET having a drain terminal in electrical communication with said drain terminal of said first MOSFET, a gate terminal in electrical communication with said second voltage input terminal, and a source terminal in electrical communication with said third voltage input terminal;
a third MOSFET having a source terminal in electrical communication with said second voltage input terminal, a gate terminal in electrical communication with said drain terminal of said first MOSFET, and a drain terminal in electrical communication with said output terminal; and
a fourth MOSFET having a gate terminal in electrical communication with said gate terminal of said third MOSFET, a source terminal in electrical communication with said third voltage input terminal, and a drain terminal in electrical communication with said output terminal.

11. A method for generating one of two reference voltages at the output of a differential power sensing circuit, comprising the steps of:

providing a first voltage input terminal, a second voltage input terminal, a third voltage input terminal, and a first output terminal;
applying a first reference voltage to said first voltage input terminal, a second reference voltage to said second voltage input terminal, and a third reference voltage to said third voltage input terminal;
generating a first output voltage at said first output terminal in response to a difference between the first reference voltage and the second reference voltage, the first output voltage varying between a first state substantially equal to the first reference voltage and a second state substantially equal to the third reference voltage;
applying the first output voltage to a first input terminal of a switching unit, said switching unit having a second input terminal in electrical communication with the second reference voltage, a third input terminal in electrical communication with a fifth reference voltage, and an output terminal;
generating a second output voltage at said output terminal of said switching unit, the second output voltage varying between a third state substantially equal to the fifth reference voltage and a fourth state substantially equal to the second reference voltage in response to the first output voltage,
wherein the first and third output states occur when the second reference voltage does not exceed the first reference voltage by a predetermined voltage and the second and fourth output states occur when the second reference voltage exceeds the first reference voltage by the predetermined voltage.

12. The method of claim 11 wherein the fifth reference voltage is equal to the third reference voltage.

* * * * *